(12) United States Patent
Liu

(10) Patent No.: US 11,287,857 B2
(45) Date of Patent: Mar. 29, 2022

(54) SHELL STRUCTURE

(71) Applicants: LITE-ON ELECTRONICS (GUANGZHOU) LIMITED, Guangzhou (CN); Lite-On Technology Corporation, Taipei (TW)

(72) Inventor: Chen-Yuan Liu, Taipei (TW)

(73) Assignees: LITE-ON ELECTRONICS (GUANGZHOU) LIMITED, Guangzhou (CN); Lite-On Technology Corporation, Taipei (TW)

( * ) Notice: Subject to any disclaimer, the term of this patent is extended or adjusted under 35 U.S.C. 154(b) by 0 days.

(21) Appl. No.: 17/143,171

(22) Filed: Jan. 7, 2021

(65) Prior Publication Data

US 2021/0255675 A1 Aug. 19, 2021

(30) Foreign Application Priority Data

Feb. 14, 2020 (CN) .......................... 202020169396.3

(51) Int. Cl.
*G06F 1/16* (2006.01)
*H05K 5/00* (2006.01)
*H05K 7/00* (2006.01)
*G06F 1/18* (2006.01)
*H05K 7/14* (2006.01)

(52) U.S. Cl.
CPC .............. *G06F 1/185* (2013.01); *G06F 1/187* (2013.01); *H05K 7/1418* (2013.01)

(58) Field of Classification Search
CPC .......... G06F 1/185; G06F 1/187; G06F 1/186; G06F 1/183; H05K 7/1418; H05K 7/1417; H05K 7/14
See application file for complete search history.

(56) References Cited

U.S. PATENT DOCUMENTS

| | | | | |
|---|---|---|---|---|
| 5,199,776 A | * | 4/1993 | Lin | G06F 1/181 312/242 |
| 6,166,325 A | * | 12/2000 | Wu | H05K 9/0039 174/377 |
| 6,330,139 B1 | * | 12/2001 | Liao | G06F 1/181 174/365 |
| 9,257,788 B1 | * | 2/2016 | Jia | G06F 1/189 |
| 9,629,291 B1 | * | 4/2017 | Chen | H05K 13/04 |
| 10,317,949 B1 | * | 6/2019 | Lin | G06F 1/166 |

(Continued)

*Primary Examiner* — Anthony M Haughton
(74) *Attorney, Agent, or Firm* — JCIPRNET

(57) ABSTRACT

A shell structure including a shell, a baffle plate, and a positioning member is provided. The shell has a first surface, a second surface opposite to the first surface, and an expansion opening and a first mounting hole penetrating the first and second surfaces. The baffle plate is detachably mounted to the shell and includes a body portion located in the expansion opening and a side wing portion located outside the expansion opening and in contact with the second surface. The side wing portion includes a second mounting hole overlapped with the first mounting hole. The positioning member passes through the first and second mounting holes, and includes a first positioning portion in contact with the first surface and a second positioning portion passing through the second mounting hole. A maximum outer diameter of the second positioning portion is greater than an inner diameter of the second mounting hole.

15 Claims, 11 Drawing Sheets

(56) References Cited

U.S. PATENT DOCUMENTS

| | | | |
|---|---|---|---|
| 10,564,684 B1* | 2/2020 | Li | G06F 1/182 |
| 2010/0027230 A1* | 2/2010 | Wu | G06F 1/186 |
| | | | 361/801 |
| 2019/0371366 A1* | 12/2019 | Gopalakrishna | H05K 5/0295 |

* cited by examiner

SHELL STRUCTURE

CROSS-REFERENCE TO RELATED APPLICATION

This application claims the priority benefit of Chinese patent application serial no. 202020169396.3, filed on Feb. 14, 2020. The entirety of the above-mentioned patent application is hereby incorporated by reference herein and made a part of this specification.

BACKGROUND OF THE INVENTION

1. Field of the Invention

The disclosure relates to a shell structure and, in particular, to a shell structure of a server or a computer host.

2. Description of Related Art

With the continuous increase of data storage and data computation, a shell of a server and a shell of a computer host mostly have an expansion hole or an expansion slot. Therefore, a user may mount a required electronic component (for example, a hard disk, an internal memory, an expansion card, an interface card, a display card, an I/O port, or a fan) in the expansion hole or the expansion slot according to actual requirements, to expand the required function. To prevent foreign matters from entering the inside of the shell, a common method is mounting a baffle plate on the expansion hole or the expansion slot on the shell. If the user has requirements for expanding functions, the user may detach the baffle plate. Generally, the baffle plate is mostly fixed on the expansion hole or the expansion slot on the shell in a mounting manner such as locking or clamping, but mechanism designs of the common mounting manner such as locking or clamping mostly have problems such as inconvenient dismounting or insufficient mounting reliability.

SUMMARY OF THE INVENTION

The disclosure provides a shell structure, which is easy to mount and has great reliability.

A shell structure of the disclosure includes a shell, a baffle plate, and a positioning member. The shell includes a first surface, a second surface opposite to the first surface, an expansion opening penetrating the first surface and the second surface, and a first mounting hole penetrating the first surface and the second surface. The baffle plate is detachably mounted to the shell, where the baffle plate includes a body portion and a side wing portion, and the body portion is located in the expansion opening. The side wing portion is located outside the expansion opening and is in contact with the second surface. The side wing portion includes a second mounting hole, and the second mounting hole is overlapped on the first mounting hole. The positioning member passes through the first mounting hole and the second mounting hole, where the positioning member includes a first positioning portion and a second positioning portion, and the first positioning portion is in contact with the first surface. The second positioning portion passes through the second mounting hole, and a maximum outer diameter of the second positioning portion is greater than an inner diameter of the second mounting hole. The second positioning portion is of a hollow structure.

In an embodiment of the disclosure, the positioning member further includes a neck located between the first positioning portion and the second positioning portion, and the neck passes through the first mounting hole. The shell structure further includes a C-shaped retaining ring buckled to the neck, where the C-shaped retaining ring is located between the side wing portion and the shell, and is in contact with the second surface.

In an embodiment of the disclosure, the neck includes an annular groove located outside the first mounting hole, and the C-shaped retaining ring is buckled to the annular groove.

In an embodiment of the disclosure, an outer diameter of the C-shaped retaining ring is greater than an inner diameter of the first mounting hole.

In an embodiment of the disclosure, an outer diameter of the first positioning portion is greater than the maximum outer diameter of the second positioning portion.

In an embodiment of the disclosure, an outer diameter of the first positioning portion is greater than an inner diameter of the first mounting hole.

In an embodiment of the disclosure, the second positioning portion includes a bottom and a ring portion connected to the bottom, and the bottom is located between the first positioning portion and the ring portion. The ring portion passes through the second mounting hole.

In an embodiment of the disclosure, the ring portion includes a bottom end connected to the bottom, a middle section connected to the bottom end, and a top end connected to the middle section, and an outer diameter of the ring portion gradually increases from the bottom end to the middle section and gradually decreases from the middle section to the top end.

In an embodiment of the disclosure, a maximum outer diameter of the second positioning portion falls in the middle section of the ring portion.

In an embodiment of the disclosure, a ratio of a height of the second positioning portion to a distance between a position at the maximum outer diameter of the second positioning portion and the bottom ranges from 1.5 to 2.5.

In an embodiment of the disclosure, a ratio of the maximum outer diameter of the second positioning portion to a radius of curvature of the middle section ranges from 1.5 to 3, and an included angle between a vertical line through the center of the top end and a diagonal through a position at the maximum outer diameter in the middle section ranges from 25 degrees to 50 degrees.

In an embodiment of the disclosure, the second positioning portion further includes a rib protruding out of the bottom, the ring portion crosses the rib, and the ring portion keeps a distance from the rib.

In an embodiment of the disclosure, the bottom and the rib are located in the second mounting hole.

In an embodiment of the disclosure, an included angle exists between a positive projection of the ring portion on the bottom and a positive projection of the rib on the bottom, and the included angle ranges from 80 degrees to 90 degrees.

In an embodiment of the disclosure, a ratio of a width of the rib to an outer diameter of the bottom is greater than or equal to 0.2.

Based on the above, the shell structure of the disclosure uses the positioning member to fix the baffle plate on the shell, where the second positioning portion of the positioning member is of a hollow structure, and is suitable for receiving a force to generate elastic deformation. Specifically, after the positioning member is mounted and fixed on the shell, the second positioning portion passes through the second mounting hole of the baffle plate. In this process, the second positioning portion is extruded to generate elastic deformation, and restores to the original shape after passing out of the second mounting hole, to fix the baffle plate on the second surface of the shell through the mechanical interference (or contact) of the second positioning portion and the second mounting hole. For a user, the mounting process of the baffle plate is extremely easy, and the baffle plate can be certainly fixed on the shell, so that the shell structure has great reliability.

To make the features and advantages of the invention clear and easy to understand, the following gives a detailed description of embodiments with reference to accompanying drawings.

DESCRIPTION OF THE EMBODIMENTS

Figure 1A:
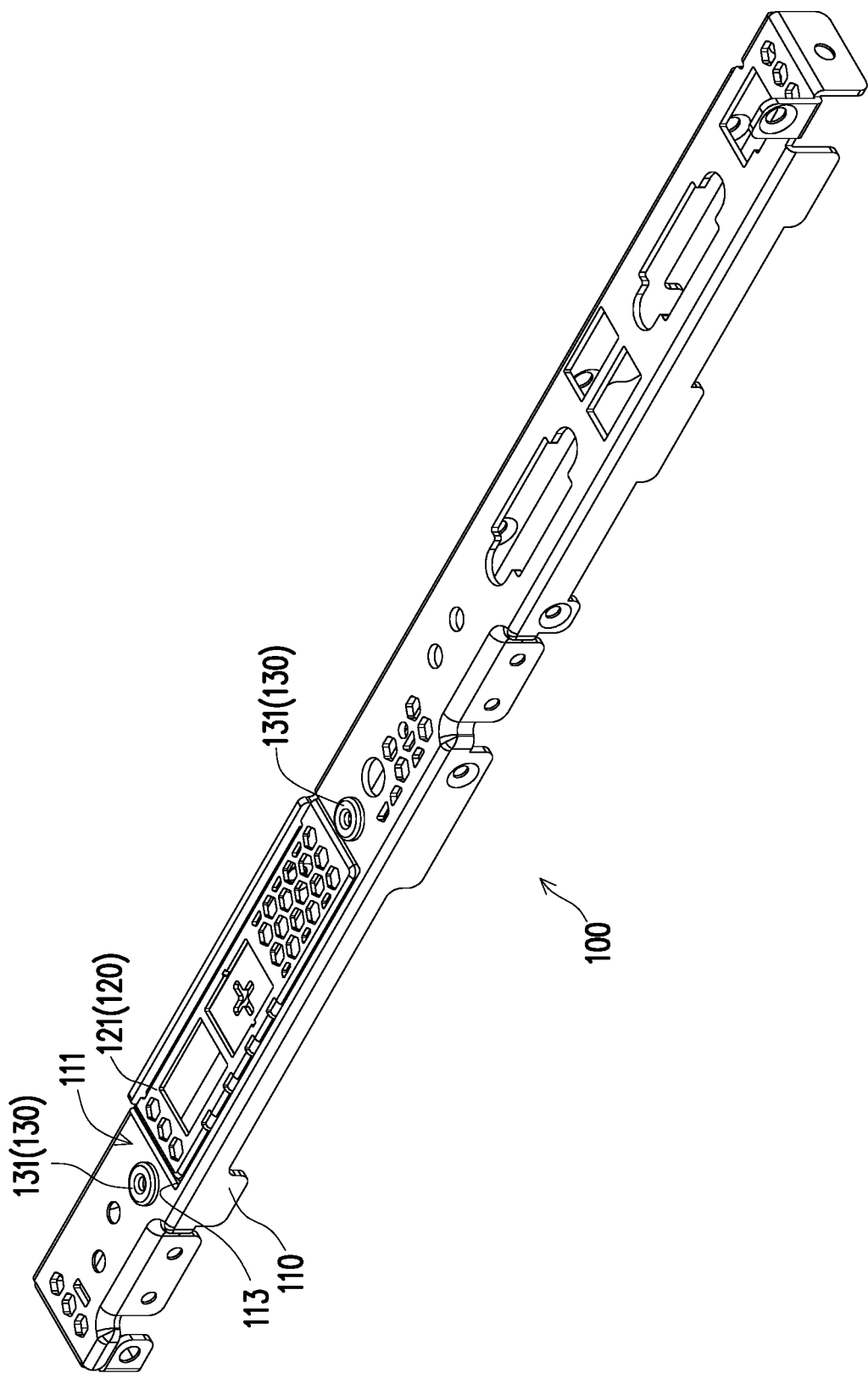
FIG. 1A is a schematic view of a shell structure according to an embodiment of the disclosure.
Figure 1B:
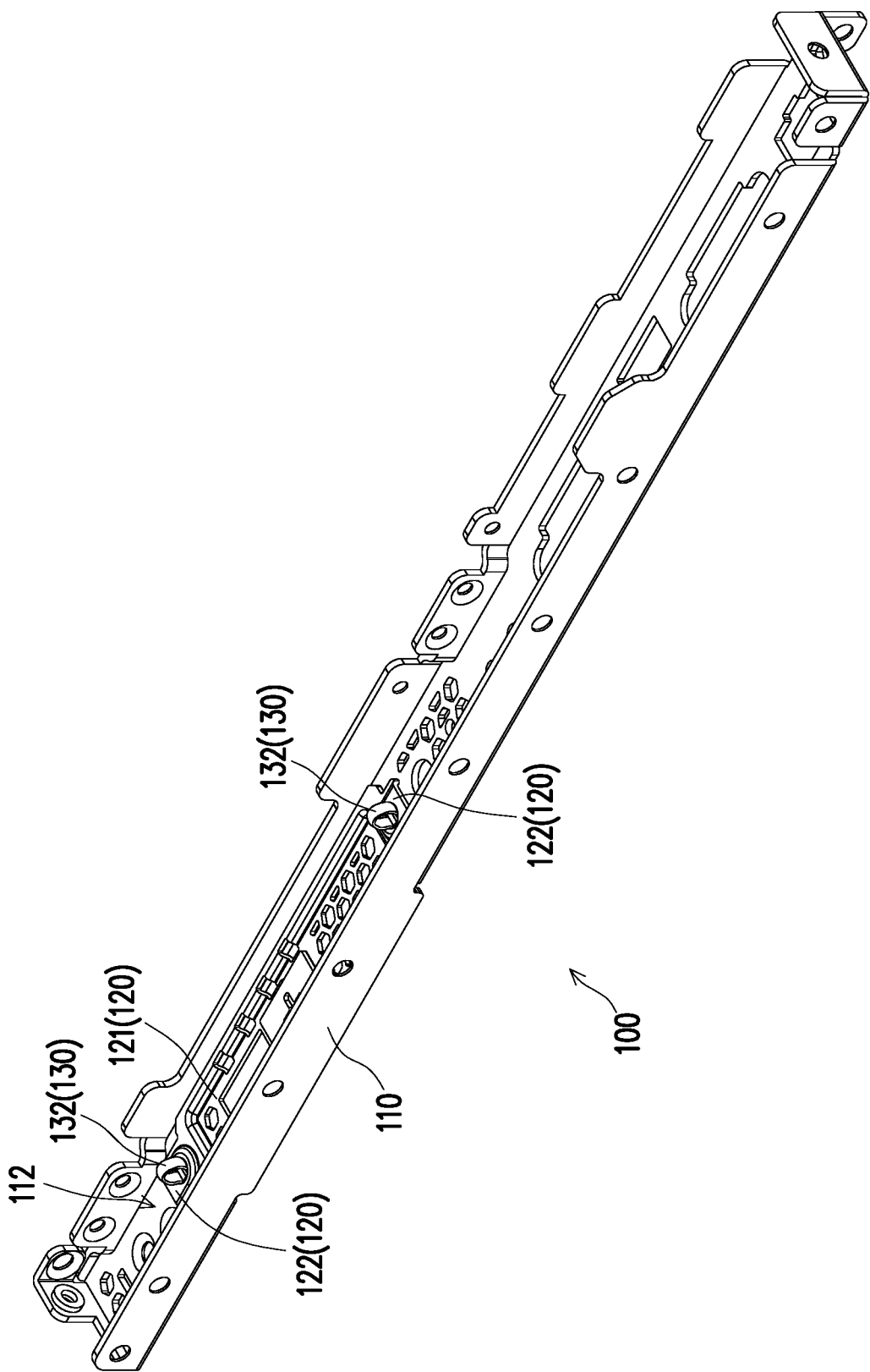
FIG. 1B is a schematic view of the shell structure from another angle of view according to an embodiment of the disclosure.
Figure 1C:
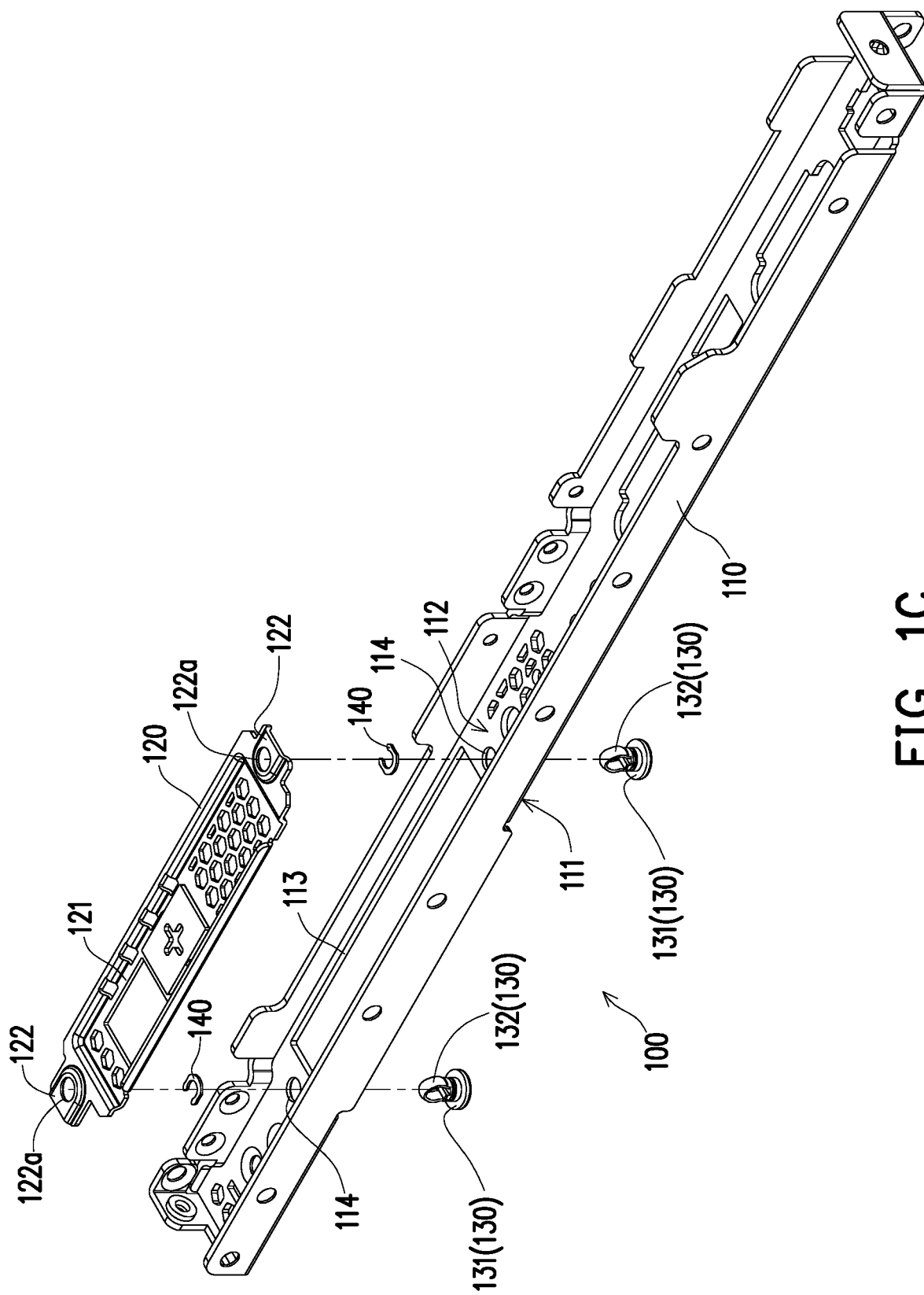
FIG. 1C is a schematic exploded view of the shell structure according to an embodiment of the disclosure.

FIG. 1A is a schematic view of a shell structure according to an embodiment of the disclosure. FIG. 1B is a schematic view of the shell structure from another angle of view according to an embodiment of the disclosure. FIG. 1C is a schematic exploded view of the shell structure according to an embodiment of the disclosure. Referring to FIG. 1A to FIG. 1C, in the present embodiment, the shell structure 100 may be applied to a server or a computer host, and includes a shell 110, a baffle plate 120, and a positioning member 130. The shell 110 includes a first surface 111, a second surface 112 opposite to the first surface 111, an expansion opening 113 penetrating the first surface 111 and the second surface 112, and a first mounting hole 114 penetrating the first surface 111 and the second surface 112. The first surface 111 may be an outer surface of the shell 110, and the second surface 112 may be an inner surface of the shell 110.

On the other hand, the expansion opening 113 may be an expansion slot, but the disclosure is not limited thereto. The expansion opening 113 may also be an expansion hole. A user may mount a required electronic component (for example, a hard disk, an internal memory, an expansion card, an interface card, a display card, an I/O port, or a fan) on the expansion opening 113 according to an actual requirement, to expand the required function. The first mounting hole 114 is located at a side of the expansion opening 113, where a quantity of the first mounting holes 114 is at least two or more, and the two first mounting holes 114 are respectively located at two opposite sides of the expansion opening 113, but the disclosure is not limited thereto. The quantity and positions of the first mounting holes 114 may be adjusted according to design requirements.

The baffle plate 120 is detachably mounted to the shell 110 and blocks the expansion opening 113, to prevent foreign matters from entering the inside of the shell. If the user has requirements for expanding functions, the user may detach the baffle plate 120. For the user, the dismounting of the baffle plate 120 is extremely easy and convenient. On the other hand, the baffle plate 120 includes a second mounting hole 122a, and a quantity of the second mounting holes 122a is the same as the quantity of the first mounting holes 114.

Figure 2A:
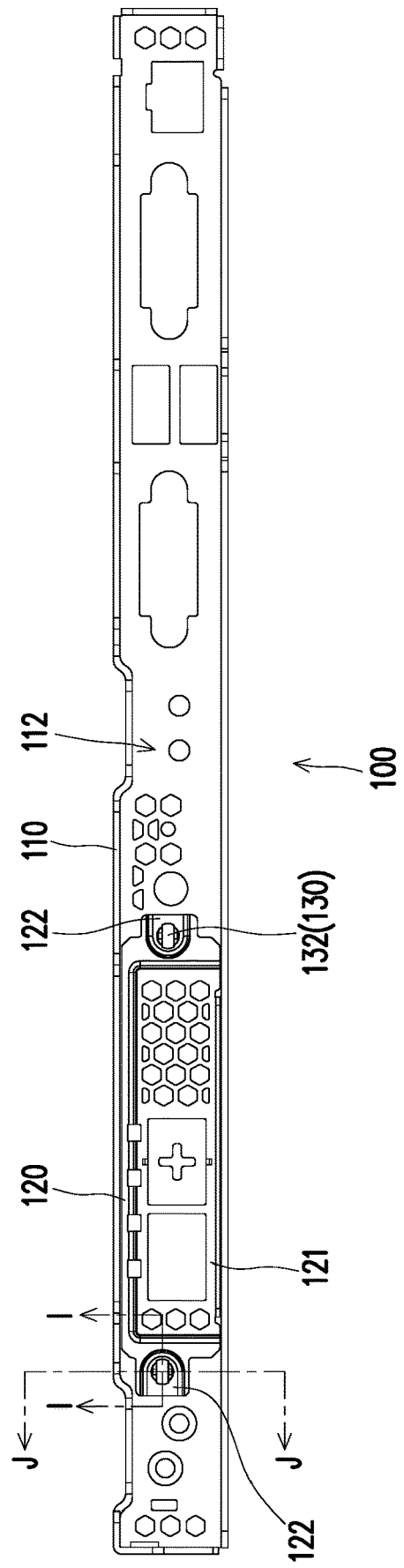
FIG. 2A is a schematic top view of the shell structure in FIG. 1B.
Figure 2B:
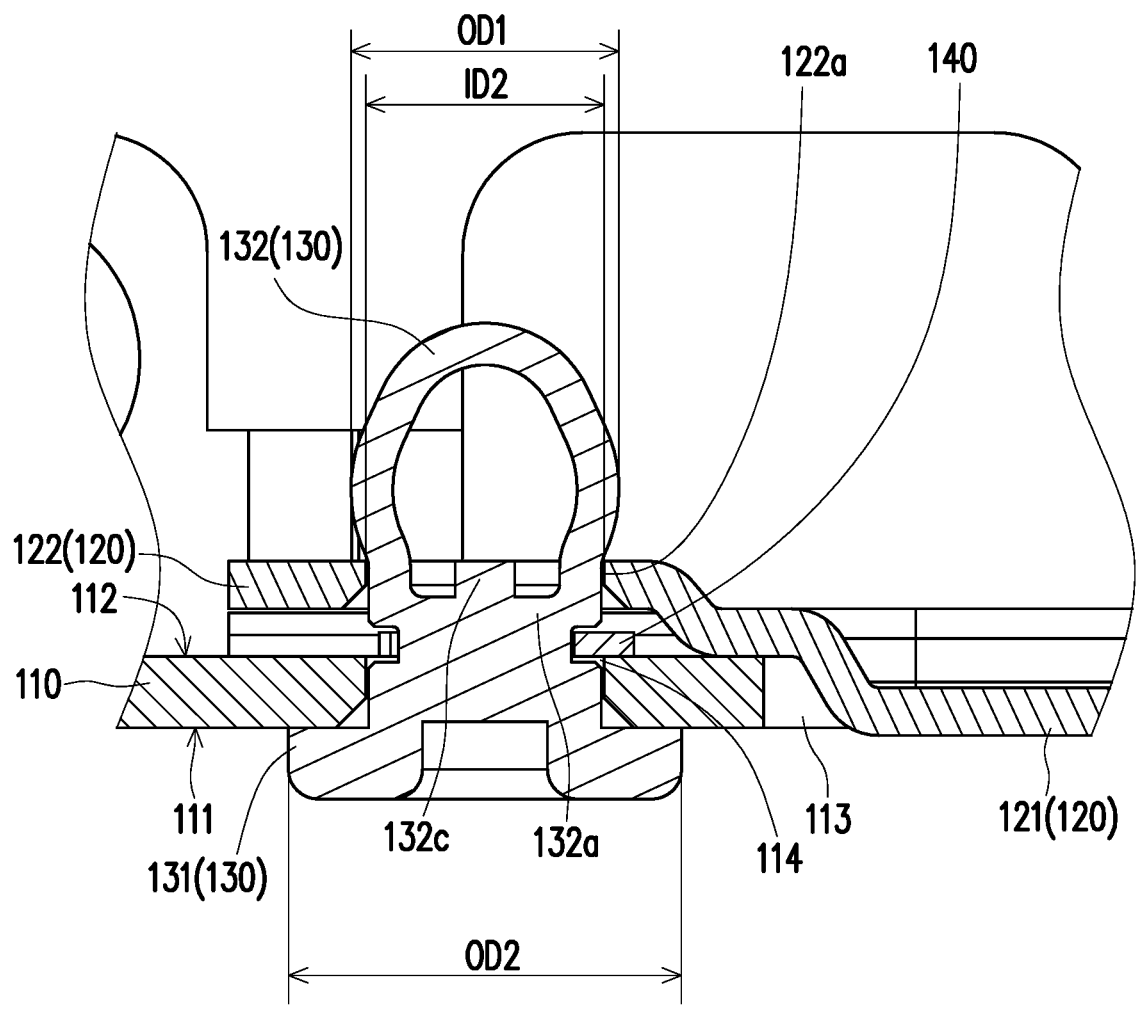
FIG. 2B is a schematic cross-sectional view of the shell structure in FIG. 2A along line I-I.
Figure 2C:
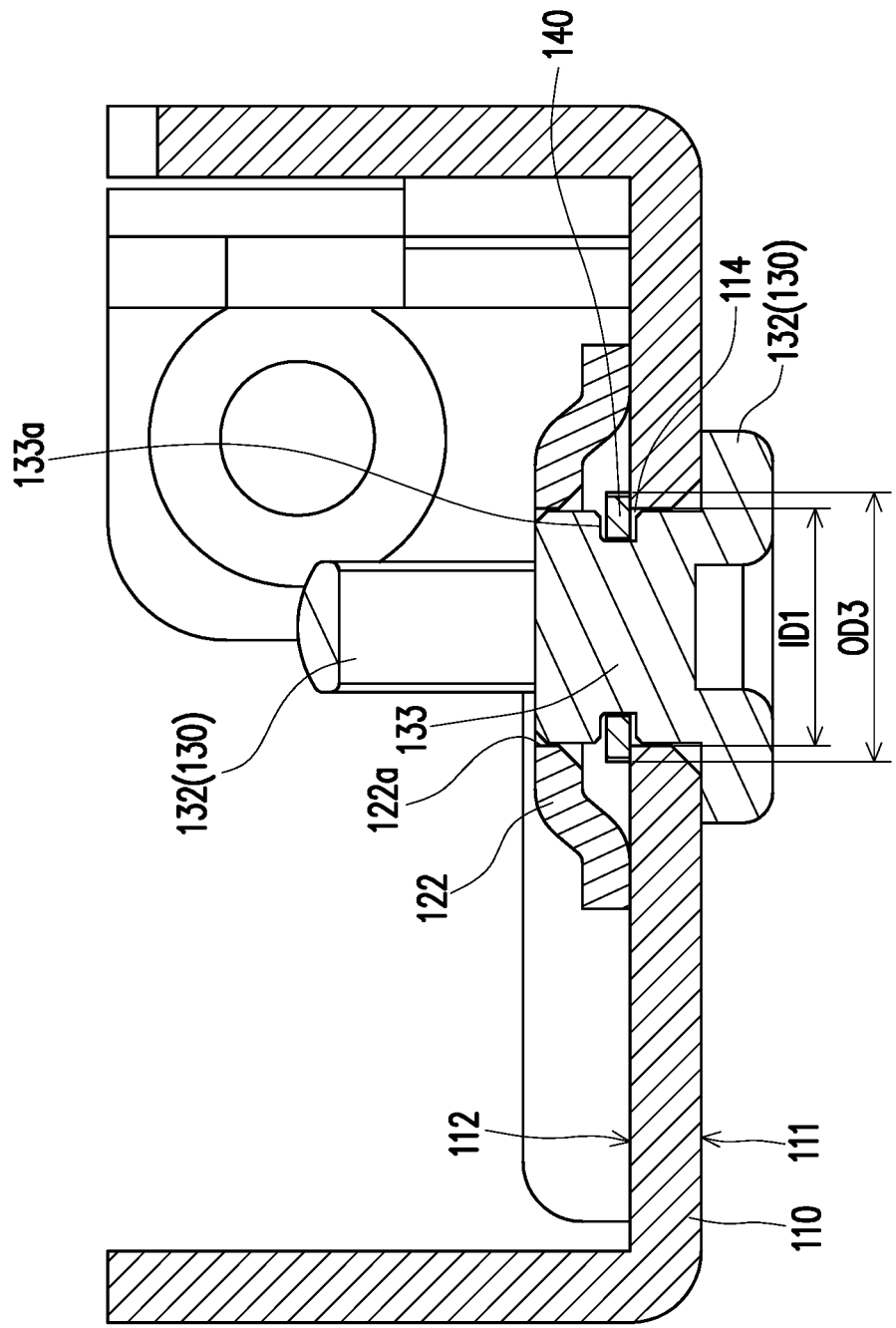
FIG. 2C is a schematic cross-sectional view of the shell structure in FIG. 2A along line J-J.

FIG. 2A is a schematic top view of the shell structure in FIG. 1B. FIG. 2B is a schematic cross-sectional view of the shell structure in FIG. 2A along line I-I. FIG. 2C is a schematic cross-sectional view of the shell structure in FIG. 2A along line J-J. Referring to FIG. 1A to FIG. 1C, FIG. 2A, and FIG. 2B, in the present embodiment, the positioning member 130 includes a first positioning portion 131 and a second positioning portion 132, and the shell structure 100 further includes a C-shaped retaining ring 140. In the process of mounting the baffle plate 120 to the shell 110, the second positioning portion 132 of the positioning member 130 first passes through the first mounting hole 114 of the shell 110 from the first surface 111 of the shell 110, and achieves a limiting effect through the mechanical interference (or contact) of the first positioning portion 131 and the first surface 111 of the shell 110, to prevent the entire positioning member 130 from passing out of the first mounting hole 114. Specifically, the second positioning portion 132 passing through the first mounting hole 114 extends in a direction away from the second surface 112 of the shell 110.

Next, the C-shaped retaining ring 140 is buckled to the positioning member 130, where the C-shaped retaining ring 140 is buckled between the first positioning portion 131 and the second positioning portion 132, and is located on the second surface 112 of the shell 110. Through the mechanical interference (or contact) of the C-shaped retaining ring 140 and the second surface 112 of the shell 110 and the mechanical interference (or contact) of the first positioning portion 131 and the first surface 111 of the shell 110, the positioning member 130 is certainly fixed on the shell 110, to prevent the positioning member 130 from slipping off the shell 110. Next, the baffle plate 120 is aligned with the expansion opening 113, and the second mounting hole 122a is aligned with the second positioning portion 132 of the positioning member 130. Then, the baffle plate 120 moves to the second surface 112 of the shell 110, and the second positioning portion 132 of the positioning member 130 passes through the second mounting hole 122a, to fix the baffle plate 120 on the second surface 112 of the shell 110 through the mechanical interference (or contact) of the second positioning portion 132 of the positioning member 130 and the second mounting hole 122a.

Based on the above, for users, the mounting process of the baffle plate 120 is extremely easy, and the baffle plate 120 can be certainly fixed on the shell 110, so that the shell structure 100 has great reliability.

On the contrary, the user only needs to apply a force to the baffle plate 120 to make the baffle plate 120 move in a direction away from the second surface 112 of the shell 110, so that the second positioning portion 132 of the positioning member 130 is extruded by the second mounting hole 122a to generate elastic deformation, to make the second positioning portion 132 of the positioning member 130 break away from the second mounting hole 122a, and detach the baffle plate 120 from the shell 11. Next, the user only needs to remove the C-shaped retaining ring 140 from the positioning member 130, and apply a force to the positioning member 130 to make the first positioning portion 131 of the positioning member 130 move in a direction away from the first surface 111 of the shell 110, so that the second positioning portion 132 of the positioning member 130 is extruded by the first mounting hole 114 to generate elastic deformation, to make the second positioning portion 132 of the positioning member 130 break away from the first mounting hole 114, and detach the positioning member 130 from the shell 11.

Particularly, in an implementation, there may be two positioning members 130, one of the two positioning members 130 passes through one set of the first mounting hole 114 and the second mounting hole 122a, and the other of the two positioning members 130 passes through the other set of the first mounting hole 114 and the second mounting hole 122a that are overlapped. In another implementation, there may be one positioning member 130, the positioning member 130 passes through one set of the first mounting hole 114 and the second mounting hole 122a that are overlapped, and a positioning member in another form passes through the other set of the first mounting holes 114 and the second mounting holes 122a that are overlapped.

As shown in FIG. 1A to FIG. 1C, the baffle plate 120 includes a body portion 121 and a side wing portion 122, where the body portion 121 is located in the expansion opening 113, and the side wing portion 122 is located outside the expansion opening 113. The body portion 121 is used for blocking the expansion opening 113, and the side wing portion 122 is used for abutting against the second surface 112 of the shell 110. In the present embodiment, there are two side wing portions 122, the two side wing portions 122 are respectively located on two opposite sides of the body portion 121, and each side wing portion 122 includes one second mounting hole 122a.

As shown in FIG. 2B and FIG. 2C, the side wing portion 122 is in contact with the second surface 112 of the shell 110, where the second mounting hole 122a is overlapped on the first mounting hole 114, and the first mounting hole 114 is greater than or equal to the second mounting hole 122a. On the other hand, the positioning member 130 passes through the first mounting hole 114 and the second mounting hole 122a, where the first positioning portion 131 is in contact with the first surface 111 of the shell 110, and the second positioning portion 132 passes through the second mounting hole 122a in a direction away from the second surface 112 of the shell 110. Through the mechanical interference (or contact) of the first positioning portion 131 and the first surface 111 of the shell 110, through the mechanical interference (or contact) of the C-shaped retaining ring 140 and the second surface 112 of the shell 110, and through the mechanical interference (or contact) of the second positioning portion 132 of the positioning member 130 and the second mounting hole 122a, the side wing portion 122 of the baffle plate 120 can be certainly fixed on the second surface 112 of the shell 110, and the body portion 121 blocks the expansion opening 113.

In the present embodiment, materials of the positioning member 130 may adopt polyamide or polypropylene, and the polyamide may be Polyamide 66. That is, the positioning member 130 has strong mechanical properties, and will not be easily damaged by repeated dismounting. On the other hand, the second positioning portion 132 is of a hollow structure, and is suitable for receiving a force to generate elastic deformation. A maximum outer diameter OD1 of the second positioning portion 132 is greater than an inner diameter ID1 of the first mounting hole 114 and an inner diameter ID2 of the second mounting hole 122a. Therefore, in the process of making the second positioning portion 132 pass through the first mounting hole 114 and the second mounting hole 122a sequentially, the second positioning portion 132 is extruded to generate elastic deformation, and restores to the original shape after passing out of the second mounting hole 122a, to prevent, through the mechanical interference (or contact) of the second positioning portion 132 and the second mounting hole 122a, the positioning member 130 from breaking away from the shell 110 and the baffle plate 120. For example, a ratio of the maximum outer diameter OD1 of the second positioning portion 132 to the inner diameter ID2 of the second mounting hole 122a ranges from 1.2 to 1.6. On the other hand, an outer diameter OD2 of the first positioning portion 131 is greater than the inner diameter ID1 of the first mounting hole 114, to ensure the generating of the mechanical interference (or contact) of the first positioning portion 131 and the first surface 111 of the shell 110.

Specifically, the positioning member 130 further includes a neck 133 located between the first positioning portion 131 and the second positioning portion 132, and the neck 133 passes through the first mounting hole 114. On the other hand, the C-shaped retaining ring 140 is buckled to the neck 133, where the C-shaped retaining ring 140 is located between the side wing portion 122 and the shell 110, and is in contact with the second surface 112. Through the mechanical interference (or contact) of the C-shaped retaining ring 140 and the second surface 112 of the shell 110, and through the mechanical interference (or contact) of the first positioning portion 131 and the first surface 111 of the shell 110, the positioning member 130 is certainly fixed on the shell 110.

In the present embodiment, the neck 133 includes an annular groove 133a located outside the first mounting hole 114, and the C-shaped retaining ring 140 is buckled to the annular groove 133a, to improve the reliability after the C-shaped retaining ring 140 and the positioning member 130 are buckled. As shown in FIG. 2B and FIG. 2C, an outer diameter OD3 of the C-shaped retaining ring 140 is greater than the inner diameter ID1 of the first mounting hole 114, to ensure the generating of the mechanical interference (or contact) of the C-shaped retaining ring 140 and the second surface 112 of the shell 110.

Figure 3B:
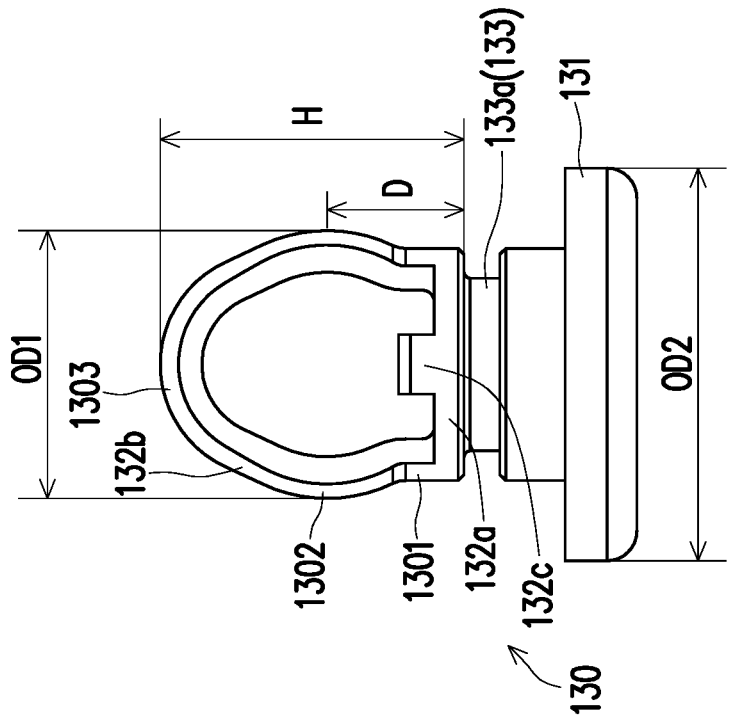
FIG. 3B is a schematic front view of the positioning member in FIG. 3A.
Figure 3A:
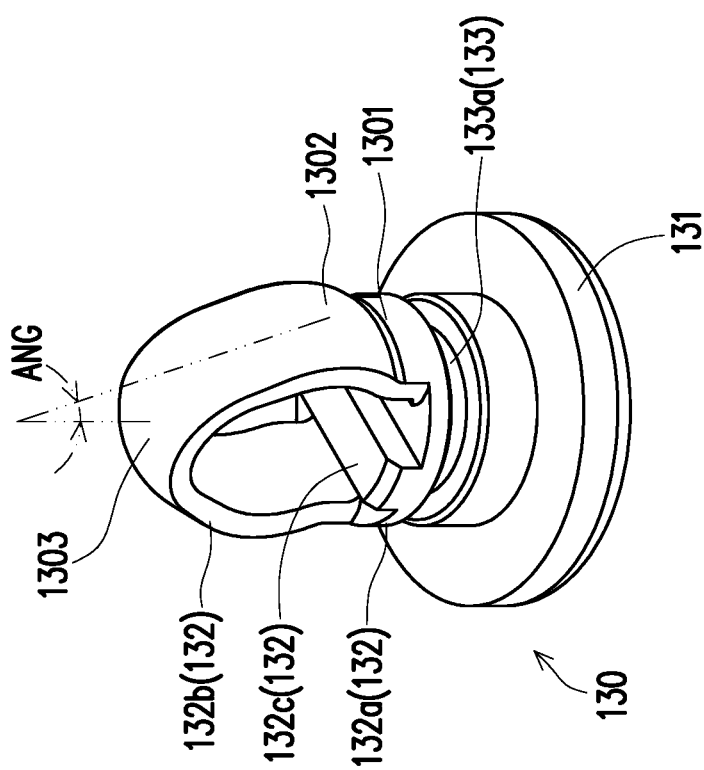
FIG. 3A is a schematic view of a positioning member in FIG. 1C.
Figure 3C:
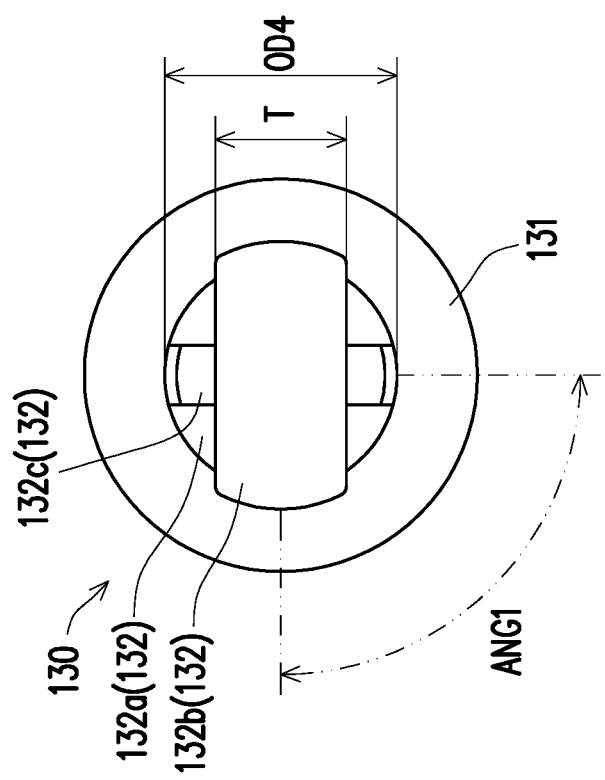
FIG. 3C is a schematic top view of the positioning member in FIG. 3A.

FIG. 3A is a schematic view of a positioning member in FIG. 1C. FIG. 3B is a schematic front view of the positioning member in FIG. 3A. FIG. 3C is a schematic top view of the positioning member in FIG. 3A. Referring to FIG. 3A to FIG. 3C, in the present embodiment, the outer diameter OD2 of the first positioning portion 131 of the positioning member 130 is greater than the maximum outer diameter OD1 of the second positioning portion 132, where the second positioning portion 132 includes a bottom 132a and a ring portion 132b connected to the bottom 132a, and the bottom 132a is located between the first positioning portion 131 and the ring portion 132b. Further, the bottom 132a is connected to the neck 133, and is located between the neck 133 and the ring portion 132b. As shown in FIG. 2B and FIG. 3A, the ring portion 132b is of a hollow structure, and passes through the second mounting hole 122a.

Referring to FIG. 3A to FIG. 3C, the ring portion 132b includes a bottom end 1301 connected to the bottom 132a, a middle section 1302 connected to the bottom end 1301, and a top end 1303 connected to the middle section 1302. An outer diameter of the ring portion 132b gradually increases from the bottom end 1301 to the middle section 1302 and gradually decreases from the middle section 1302 to the top end 1303, and the maximum outer diameter OD1 of the second positioning portion 132 falls in the middle section 1302. For example, an overall height of the second positioning portion 132 is H, a distance between a position at the maximum outer diameter OD1 in the second positioning portion 132 and the bottom 132a is D, and a ratio of the height H to the distance D ranges from 1.5 to 2.5. On the other hand, a ratio of the maximum outer diameter OD1 of the second positioning portion 132 to a radius of curvature of the middle section 1302 ranges from 1.5 to 3, an included angle between a vertical line through the center of the top end 1303 and a diagonal through a position at the maximum outer diameter OD1 in the middle section 1302 is ANG, and the included angle ANG ranges from 25 degrees to 50 degrees.

As shown in FIG. 3C, a ratio of an outer diameter OD4 of the bottom 132a to a thickness T of the ring portion 132b ranges from 1.5 to 3. This parameter setting helps improve the manufacturing yield, and ensures the value of the elastic coefficient of the ring portion 132b to be moderate, to avoid impeding the dismounting of the positioning member 130. As shown in FIG. 2B and FIG. 3A to FIG. 3C, the second positioning portion 132 further includes a rib 132c protruding out of the bottom 132a, where the ring portion 132b crosses the rib 132c, and keeps a distance from the rib 132c. On the other hand, the bottom 132a and the rib 132c are located in the second mounting hole 122a, to prevent the second positioning portion 132 from floating in the second mounting hole 122a. For example, a ratio of a width of the rib 132c to the outer diameter OD4 of the bottom 132a may be greater than or equal to 0.2. An included angle ANG1 exists between a positive projection of the ring portion 132b on the bottom 132a and a positive projection of the rib 132c on the bottom 132a, and the included angle ANG1 ranges from 80 degrees to 90 degrees.

Figure 4A:
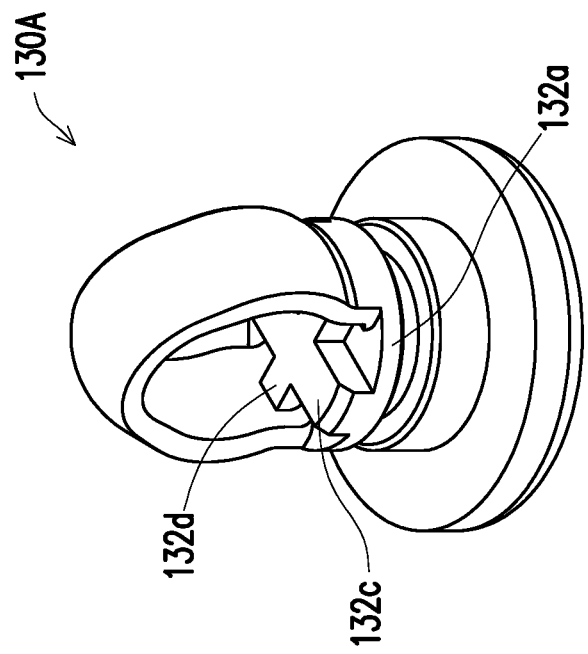
FIG. 4A to FIG. 4G are schematic views of positioning members according to other embodiments of the disclosure.
Figure 4C:
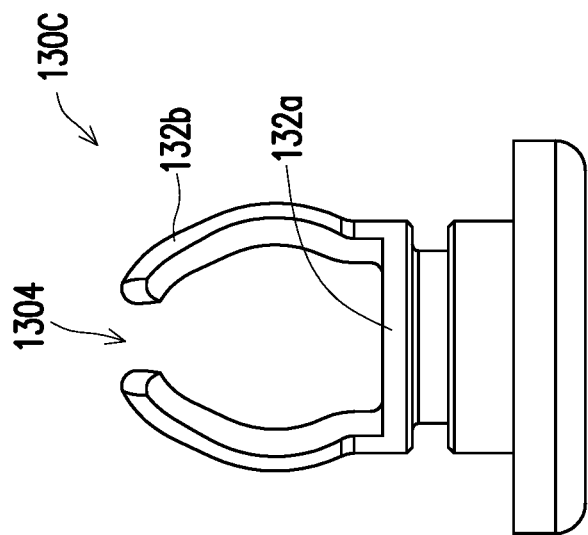
Figure 4B:
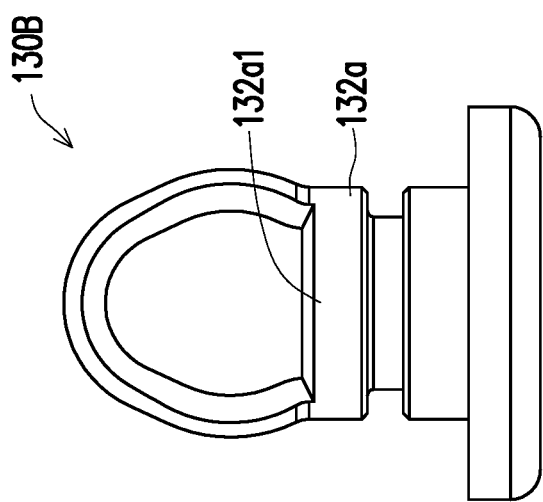
Figure 4E:
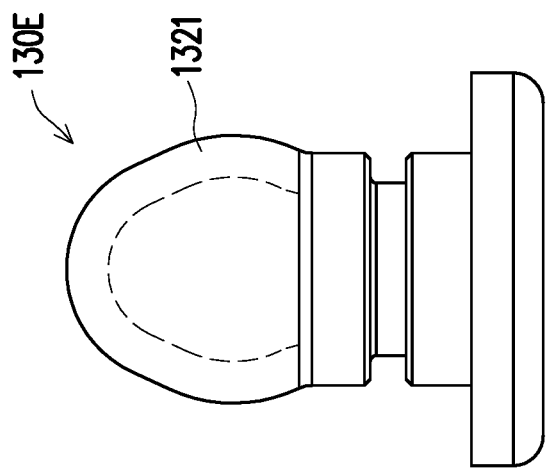
Figure 4D:
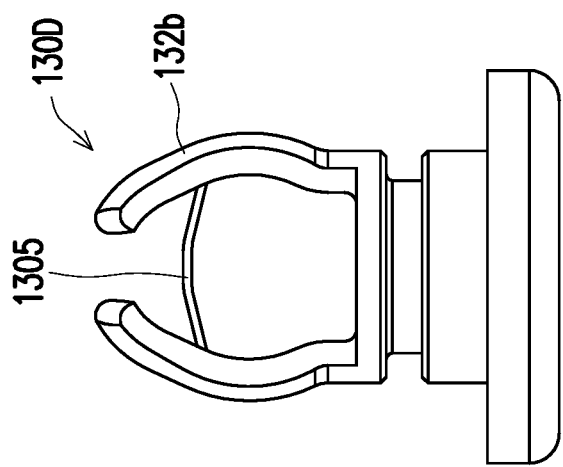

FIG. 4A to FIG. 4G are schematic views of positioning members according to other embodiments of the disclosure. Referring to FIG. 4A, compared with the positioning member 130 in FIG. 3A, the positioning member 130A in FIG. 4A further includes a rib 132d protruding out of the bottom 132a and interlaced with the rib 132c. Referring to FIG. 4B, compared with the positioning member 130 in FIG. 3B, a rib 132a1 of the positioning member 130B in FIG. 4B occupies a top surface of the bottom 132a. Referring to FIG. 4C, compared with the positioning member 130 in FIG. 3B, a top surface of the bottom 132a of the positioning member 130C in FIG. 4C includes no rib, and the top end 1303 of the ring portion 132b includes a through slot 1304, to disconnect the ring portion 132b. Referring to FIG. 4D, compared with the positioning member 130C in FIG. 4C, the positioning member 130D in FIG. 4D includes a strengthening arm 1305, where the strengthening arm 1305 is connected to the disconnected ring portion 132b.

Figure 4G:
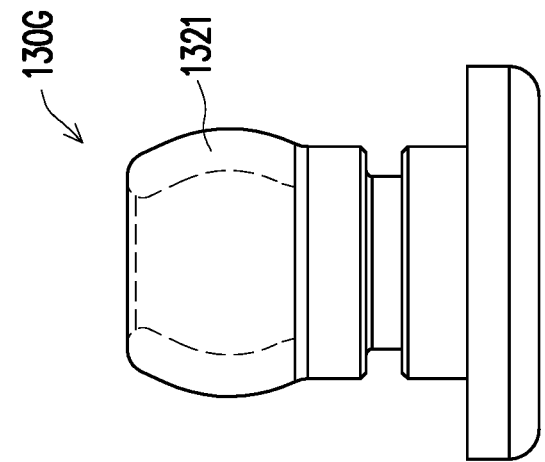
Figure 4F:
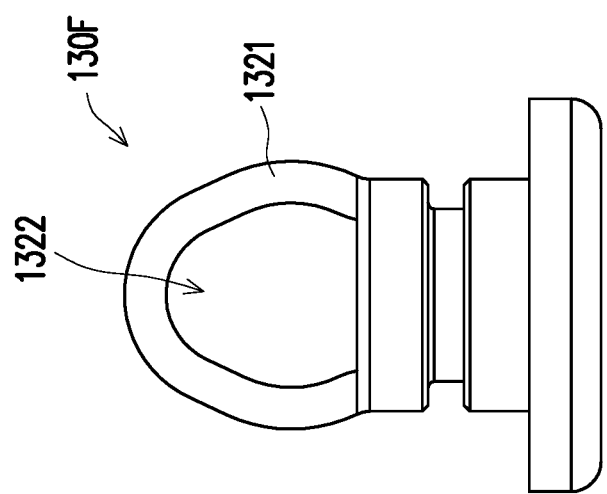

Referring to FIG. 4E, compared with the positioning member 130 in FIG. 3B, the second positioning portion 1321 of the positioning member 130E in FIG. 4E adopts a pacifier type design, and includes a hollow cavity internally. Referring to FIG. 4F, compared with the positioning member 130E in FIG. 4E, the second positioning portion 1321 of the positioning member 130F in FIG. 4F is penetrated by a through hole 1322. Referring to FIG. 4G, compared with the positioning member 130E in FIG. 4E, the top end of the second positioning portion 1321 of the positioning member 130G in FIG. 4G is partially removed, so that the hollow cavity is linked to the outside.

Particularly, the first positioning portion of the positioning member may be of a circular plate shape or a rectangular plate shape, and a bottom surface of the first positioning portion may or may not include a groove, or the first positioning portion is penetrated by a through hole.

Based on the above, the shell structure of the disclosure uses the positioning member to fix the baffle plate on the shell, where the second positioning portion of the positioning member is of a hollow structure, and is suitable for receiving a force to generate elastic deformation. Specifically, after the positioning member is mounted and fixed on the shell, the first positioning portion of the positioning member is in contact with the first surface of the shell, and the second positioning portion passes through the first mounting hole of the shell. Next, the C-shaped retaining ring is buckled between the first positioning portion and the second positioning portion, and is in contact with the second surface of the shell, to certainly fix the positioning member on the shell through the mechanical interference (or contact) of the C-shaped retaining ring and the second surface of the shell and the mechanical interference (or contact) of the first positioning portion and the first surface of the shell. Next, the second positioning portion passes through the second mounting hole of the baffle plate. In this process, the second positioning portion is extruded to generate elastic deformation, and restores to the original shape after passing out of the second mounting hole, to fix the baffle plate on the second surface of the shell through the mechanical interference (or contact) of the second positioning portion and the second mounting hole. For the user, the mounting process of the baffle plate is extremely easy, and the baffle plate can be certainly fixed on the shell, so that the shell structure has great reliability.

It should be finally noted that the above embodiments are merely intended for describing the technical solutions of the disclosure rather than limiting the disclosure. Although the disclosure is described in detail with reference to the foregoing embodiments, those of ordinary skill in the art should understand that they can still make modifications to the technical solutions described in the foregoing embodiments or make equivalent substitutions to some technical features thereof, without departing from scope of the technical solutions of the embodiments of the disclosure.

What is claimed is:

1. A shell structure, comprising:
    a shell, having a first surface, a second surface opposite to the first surface, an expansion opening penetrating the first surface and the second surface, and a first mounting hole penetrating the first surface and the second surface;
    a baffle plate, detachably mounted to the shell, wherein the baffle plate comprises a body portion and a side wing portion, the body portion is located in the expansion opening, the side wing portion is located outside the expansion opening and is in contact with the second surface, the side wing portion comprises a second mounting hole, and the second mounting hole is overlapped with the first mounting hole; and
    a positioning member, passing through the first mounting hole and the second mounting hole, wherein the positioning member comprises a first positioning portion and a second positioning portion, the first positioning portion is in contact with the first surface, the second positioning portion passes through the second mounting hole, a maximum outer diameter of the second positioning portion is greater than an inner diameter of the second mounting hole, and the second positioning portion is of a hollow structure.

2. The shell structure according to claim 1, wherein the positioning member further comprises a neck located between the first positioning portion and the second positioning portion, the neck passes through the first mounting hole, and the shell structure further comprises a C-shaped retaining ring buckled to the neck, wherein the C-shaped retaining ring is located between the side wing portion and the shell, and is in contact with the second surface.

3. The shell structure according to claim 2, wherein the neck has an annular groove located outside the first mounting hole and the C-shaped retaining ring is buckled to the annular groove.

4. The shell structure according to claim 2, wherein an outer diameter of the C-shaped retaining ring is greater than an inner diameter of the first mounting hole.

5. The shell structure according to claim 1, wherein an outer diameter of the first positioning portion is greater than the maximum outer diameter of the second positioning portion.

6. The shell structure according to claim 1, wherein an outer diameter of the first positioning portion is greater than an inner diameter of the first mounting hole.

7. The shell structure according to claim 1, wherein the second positioning portion comprises a bottom and a ring portion connected to the bottom, the bottom is located between the first positioning portion and the ring portion, and the ring portion passes through the second mounting hole.

8. The shell structure according to claim 7, wherein the ring portion has a bottom end connected to the bottom, a middle section connected to the bottom end, and a top end connected to the middle section, and an outer diameter of the ring portion gradually increases from the bottom end to the middle section and gradually decreases from the middle section to the top end.

9. The shell structure according to claim 8, wherein the maximum outer diameter of the second positioning portion falls in the middle section of the ring portion.

10. The shell structure according to claim 8, wherein a ratio of a height of the second positioning portion to a distance between a position at the maximum outer diameter of the second positioning portion and the bottom ranges from 1.5 to 2.5.

11. The shell structure according to claim 8, wherein a ratio of the maximum outer diameter of the second positioning portion to a radius of curvature of the middle section ranges from 1.5 to 3, and an included angle between a vertical line through a center of the top end and a diagonal through a position at the maximum outer diameter in the middle section ranges from 25 degrees to 50 degrees.

12. The shell structure according to claim 7, wherein the second positioning portion further comprises a rib protruding out of the bottom, the ring portion crosses the rib, and the ring portion keeps a distance from the rib.

13. The shell structure according to claim 12, wherein the bottom and the rib are located in the second mounting hole.

14. The shell structure according to claim 12, wherein an included angle exists between a positive projection of the ring portion on the bottom and a positive projection of the rib on the bottom, and the included angle ranges from 80 degrees to 90 degrees.

15. The shell structure according to claim 12, wherein a ratio of a width of the rib to an outer diameter of the bottom is greater than or equal to 0.2.

* * * * *